(12) United States Patent
Miyagawa et al.

(10) Patent No.: US 7,333,346 B2
(45) Date of Patent: Feb. 19, 2008

(54) CIRCUIT BOARD HAVING TEST COUPON AND METHOD FOR EVALUATING THE CIRCUIT BOARD

(75) Inventors: Tomoyuki Miyagawa, Nukata-gun (JP); Toshiharu Shiratsuchi, Farmington Hills, MI (US); Isao Tanooka, Tokai (JP); Hideaki Sugiura, Handa (JP)

(73) Assignee: DENSO CORPORATION, Kariya (JP)

( * ) Notice: Subject to any disclaimer, the term of this patent is extended or adjusted under 35 U.S.C. 154(b) by 212 days.

(21) Appl. No.: 10/983,977

(22) Filed: Nov. 9, 2004

(65) Prior Publication Data
US 2005/0116224 A1 Jun. 2, 2005

(30) Foreign Application Priority Data
Nov. 11, 2003 (JP) ............... 2003-381586

(51) Int. Cl.
  *H05K 1/00* (2006.01)
(52) U.S. Cl. ..................... 361/784
(58) Field of Classification Search .......... 361/784; 430/15, 18, 280.1
See application file for complete search history.

(56) References Cited

U.S. PATENT DOCUMENTS

| | | | | |
|---|---|---|---|---|
| 3,523,542 A | * | 8/1970 | Eisler | 132/229 |
| 4,665,468 A | * | 5/1987 | Dohya | 361/794 |
| 5,680,056 A | * | 10/1997 | Ito et al. | 324/750 |
| 5,700,607 A | * | 12/1997 | Rath et al. | 430/15 |
| 6,154,038 A | * | 11/2000 | Ito et al. | 324/750 |
| 6,411,194 B2 | | 6/2002 | Shindoh et al. | |
| 2002/0094604 A1 | * | 7/2002 | Hayama et al. | 438/108 |

2002/0171530 A1 11/2002 Shindoh et al.

FOREIGN PATENT DOCUMENTS

| | | |
|---|---|---|
| JP | U-S54-048352 | 9/1952 |
| JP | A-59-138343 | 8/1984 |
| JP | A-S61-015394 | 1/1986 |
| JP | A-05-034398 | 2/1993 |
| JP | A-05-160544 | 6/1993 |
| JP | A-05-283822 | 10/1993 |
| JP | A-05-302955 | 11/1993 |
| JP | A-6-140788 | 5/1994 |
| JP | A-08-122817 | 5/1996 |
| JP | A-10-050143 | 2/1998 |
| JP | A-2002-164625 | 6/2002 |

OTHER PUBLICATIONS

Notice of Reason for Refusal mailed on Aug. 21, 2007 in corresponding Japanese patent application No. 2003-381586 (and English translation).

Notice of Reason for Refusal mailed on Aug. 21, 2007 in corresponding Japanese patent application No. 2003-302938 (and English translation).

* cited by examiner

*Primary Examiner*—Dean A. Reichard
*Assistant Examiner*—Abiy Getachew
(74) *Attorney, Agent, or Firm*—Posz Law Group, PLC

(57) ABSTRACT

A circuit board includes: a substrate; a conductive pattern disposed on a surface of the substrate; a lower insulation layer disposed on the conductive pattern to cover the conductive pattern except for an opening, through which the conductive pattern is partially exposed from the lower insulation layer; a conductor disposed on the lower insulation layer and connecting to the conductive pattern through the opening; an upper insulation layer disposed on the conductor for covering the conductor and the lower insulation layer; and a test coupon disposed on the substrate for evaluating the conductor.

30 Claims, 9 Drawing Sheets

CIRCUIT BOARD HAVING TEST COUPON AND METHOD FOR EVALUATING THE CIRCUIT BOARD

CROSS REFERENCE TO RELATED APPLICATIONS

This application is based on Japanese Patent Applications No. 2003-381586 filed on Nov. 11, 2003, and No. 2003-302938 filed on Aug. 27, 2003, the disclosures of which are incorporated herein by references.

FIELD OF THE INVENTION

The present invention relates to a circuit board having a test coupon for evaluating the circuit board and a method for evaluating the circuit board.

BACKGROUND OF THE INVENTION

A circuit board having a conductive paste layer for connecting to a conductive pattern formed on a surface of an insulation substrate is disclosed, for example, in Japanese Patent Application Publication No. H06-140788. The circuit board includes a substrate as the insulation substrate, a copper pattern as the conductive pattern, an under coat layer as a lower insulation layer, a conductor as a shield layer and an over coat layer as an upper insulation layer, which are laminated in this order. The copper pattern is disposed on the surface of the substrate. The lower insulation layer covers the copper pattern. The copper pattern is exposed from the lower insulation layer through a contact hole so that the copper pattern electrically contacts the conductor. The upper insulation layer covers whole of the conductor, the lower insulation layer and the copper pattern completely.

Therefore, in the circuit board, it is difficult to evaluate the characteristics of the conductor. Further, it is difficult to determine whether the circuit board having the conductor has good performance.

SUMMARY OF THE INVENTION

In view of the above-described problem, it is an object of the present invention to provide a circuit board having a test coupon for evaluating the circuit board. It is another object of the present invention to provide a method for evaluating a circuit board.

A circuit board includes: a substrate; an unit conductive pattern disposed on a surface of the substrate; a lower insulation layer disposed on the unit conductive pattern to cover the unit conductive pattern except for an unit opening, through which the unit conductive pattern is partially exposed from the lower insulation layer; a conductor disposed on the lower insulation layer and connecting to the unit conductive pattern through the unit opening; an upper insulation layer disposed on the conductor for covering the conductor and the lower insulation layer; and a test coupon disposed on the substrate for evaluating the conductor.

Although the conductor is covered with the upper insulation layer, the characteristics of the conductor can be evaluated so that the circuit board is also evaluated.

Preferably, the unit conductive pattern includes a plurality of conductive patterns, and the unit opening includes a plurality of openings corresponding to the conductive patterns, respectively. The test coupon is a resistance measurement test coupon, which includes a plurality of resistance measurement terminals corresponding to the conductive patterns, respectively. The conductor connects to each conductive pattern at a connection portion through the opening. Each conductive pattern is partially exposed on a surface of the circuit board from the lower and upper insulation layers so that the resistance measurement terminal is provided by the exposed conductive pattern. Each resistance measurement terminal is disposed near the connection portion.

Preferably, the unit conductive pattern includes first to third conductive patterns, and the unit opening includes first to third openings corresponding to the first to third conductive patterns, respectively. The test coupon is a resistance measurement test coupon, which includes first to third resistance measurement terminals. The conductor connects to the first to third conductive patterns at first to third connection portions through the first to third openings. The first to third conductive patterns are partially exposed on a surface of the circuit board from the lower and upper insulation layers so that the first to third resistance measurement terminals are provided by the exposed first to third conductive patterns, respectively. The first to third resistance measurement terminals are disposed near the first to third connection portions, respectively. More preferably, the test coupon is capable of measuring a resistance of the second connection portion between the conductor and the second conductive pattern. Further, more preferably, the unit conductive pattern further includes a fourth conductive pattern, and the unit opening further includes a fourth opening corresponding to the fourth conductive pattern. The conductor connects to the fourth conductive pattern at a fourth connection portion through the fourth opening. The test coupon further includes a fourth resistance measurement terminal. The fourth conductive pattern is partially exposed on the surface of the circuit board from the lower and upper insulation layers so that the fourth resistance measurement terminal is provided by the exposed fourth conductive pattern. The fourth resistance measurement terminal is disposed near the fourth connection portion. Furthermore preferably, the test coupon is capable of measuring resistances of the second and third connection portions and a resistance of the conductor disposed between the second and third connection portions.

Preferably, the test coupon is a thickness measurement test coupon for measuring a thickness of at least one of the lower insulation layer, the conductor, and the upper insulation layer. More preferably, the test coupon further includes two parts of the substrate disposed on both ends of the test coupon and exposed on the surface of the circuit board.

Preferably, the test coupon is an adhesiveness measurement test coupon for measuring an adhesiveness between the unit conductive pattern and the conductor.

Preferably, the test coupon is an insulation performance measurement test coupon for measuring an insulation performance of the lower insulation layer.

Further, a method for evaluating a circuit board is provided. The circuit board includes: a substrate; a conductive pattern disposed on a surface of the substrate; a lower insulation layer disposed on the conductive pattern to cover the conductive pattern except for an opening, through which the conductive pattern is partially exposed from the lower insulation layer; a conductor disposed on the lower insulation layer and connecting to the conductive pattern through the opening; and an upper insulation layer disposed on the conductor for covering the conductor and the lower insulation layer. The method includes the step of: evaluating the conductor by a test coupon disposed on the substrate.

Although the conductor is covered with the upper insulation layer, the characteristics of the conductor are evaluated by the above method so that the circuit board is also evaluated.

Preferably, the conductive pattern includes three or more conductive patterns, and the opening includes three or more openings corresponding to the conductive patterns, respectively. The test coupon is a resistance measurement test coupon, which includes three or more resistance measurement terminals corresponding to the conductive patterns, respectively. The conductor connects to each conductive pattern at a connection portion through the opening. Each conductive pattern is partially exposed on a surface of the circuit board from the lower and upper insulation layers so that the resistance measurement terminal is provided by the exposed conductive pattern. Each resistance measurement terminal is disposed near the connection portion. The step of evaluating the circuit board includes the steps of: selecting three neighboring resistance measurement terminals defined as first to third resistance measurement terminals, wherein the connection portions corresponding to the first to third resistance measurement terminals are defined as first to third connection portions, which are aligned on the substrate in this order, and wherein the conductive patterns corresponding to the first to third resistance measurement terminals are defined as first to third conductive patterns; measuring three resistances between two resistance measurement terminals selected among the first to third resistance measurement terminals, wherein three resistances are defined as Rmab, Rmbc, and Rmca, wherein the resistance of Rmab is measured between the first and second resistance measurement terminals, wherein the resistance of Rmbc is measured between the second and third resistance measurement terminals, and wherein the resistance of Rmca is measured between the third and first resistance measurement terminals; and calculating a resistance of the second connection portion between the conductor and the second conductive pattern on the basis of a foumula of Rkb=(Rmab+Rmbc−Rmca)/2, in which the resistance of the second connection portion is defined as Rkb. More preferably, the step of evaluating the circuit board further includes the step of: repeating the steps of selecting, measuring and calculating so that resistances of the connection portions disposed in a middle of the aligned connection portions are obtained.

Preferably, the conductive pattern includes four or more conductive patterns, and the opening includes four or more openings corresponding to the conductive patterns, respectively. The test coupon is a resistance measurement test coupon, which includes four or more resistance measurement terminals corresponding to the conductive patterns, respectively. The conductor connects to each conductive pattern at a connection portion through the opening. Each conductive pattern is partially exposed on a surface of the circuit board from the lower and upper insulation layers so that the resistance measurement terminal is provided by the exposed conductive pattern. Each resistance measurement terminal is disposed near the connection portion. The step of evaluating the circuit board includes the steps of: selecting four neighboring resistance measurement terminals defined as first to fourth resistance measurement terminals, wherein the connection portions corresponding to the first to fourth resistance measurement terminals are defined as first to fourth connection portions, which are aligned on the substrate in this order, and wherein the conductive patterns corresponding to the first to fourth resistance measurement terminals are defined as first to fourth conductive patterns; measuring five resistances between two resistance measurement terminals selected among the first to fourth resistance measurement terminals, wherein five resistances are defined as Rmab, Rmbc, Rmcd, Rmca, Rmdb, wherein the resistance of Rmab is measured between the first and second resistance measurement terminals, wherein the resistance of Rmbc is measured between the second and third resistance measurement terminals, wherein the resistance of Rmcd is measured between the third and fourth resistance measurement terminals, wherein the resistance of Rmca is measured between the third and first resistance measurement terminals, and wherein the resistance of Rmdb is measured between the fourth and second resistance measurement terminals; calculating a resistance of the second connection portion between the conductor and the second conductive pattern on the basis of a foumula of Rkb=(Rmab+Rmbc−Rmca)/2, in which the resistance of the second connection portion is defined as Rkb; calculating a resistance of the third connection portion between the conductor and the third conductive pattern on the basis of a foumula of Rkc=(Rmbc+Rmcd−Rmdb)/2, in which the resistance of the third connection portion is defined as Rkc; calculating a resistance of a part of the conductor disposed between the second and third connection portions on the basis of a foumula of Rvbc=Rmbc−Rkb−Rkc, in which the resistance of the part of the conductor is defined as Rvbc. More preferably, the step of evaluating the circuit board further includes the step of: repeating the steps of selecting, measuring and calculating so that resistances of the connection portions disposed in a middle of the aligned connection portions and resistances of parts of the conductor disposed in the middle of the aligned connection portions are obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 11:
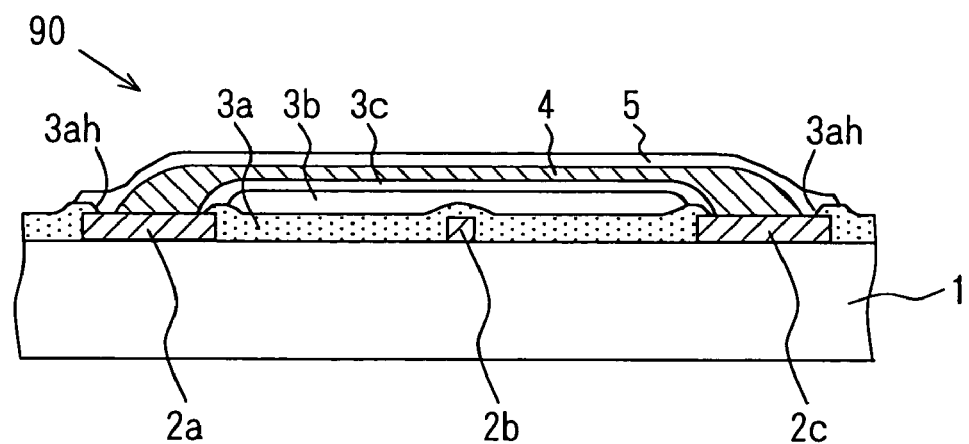
FIG. 11 is a cross sectional view showing a part of a circuit board according to a comparison of the first embodiment.

The inventors have preliminarily studied about a circuit board as a comparison. The circuit board has a conductive paste layer as a conductor. The circuit board 90 is shown in FIG. 11. The circuit board 90 includes an insulation substrate 1, multiple conductive patterns 2a-2c, lower insulation layers 3a-3c, a conductive paste layer 4, and an upper insulation layer 5.

The conductive patterns 2a-2c are disposed on the surface of the insulation substrate 1. The lower insulation layers 3a-3c cover the conductive patterns 2a-2c. One of the lower insulation layer 3a is a solder resist layer, and has an opening 3ah so that two conductive patterns 2a, 2c are partially exposed from the lower insulation layer 3a through the opening 3ah. The other two lower insulation layers 3b, 3c provide a double layered under coat layer, which insulates the conductive pattern 2b from the other two conductive patterns 2a, 2c. The conductive paste layer 4 is formed on the lower insulation layers 3a-3c. The conductive paste layer 4 is made of conductive paste. However, the conductive paste layer 4 can be made of other materials by other manufacturing method such as a sputtering method and a CVD method as long as the conductive paste layer 4 provides a conductor. The conductive paste layer 4 connects to the conductive patterns 2a, 2c through the opening 3ah. The upper insulation layer 5 covers the conductive paste layer 4 completely. The upper insulation layer 5 is an over coat layer for protecting the conductive paste layer 4 from migration and the like.

The conductive paste layer 4 works as a jumper wire for connecting to the conductive patterns 2a, 2c exposed from the lower insulation layer 3a through the opening 3ah. Further, the conductive paste layer 4 can provide a shield for shielding the conductive pattern 2b.

The lower insulation layers 3a-3c, the conductive paste layer 4, and the upper insulation layer 5 in this order are formed on the conductive patterns 2a-2c disposed on the insulation substrate 1 by a printing method. The performance of the jumper wire and/or the shield provided by the conductive paste layer 4 has variations according to a deviation of a thickness of the conductive paste layer 4. However, the conductive paste layer 4 is completely covered with the lower insulation layers 3a-3c and the upper insulation layer 5. Therefore, in the circuit board 90, it is difficult to evaluate the characteristics of the conductive paste layer 4 as the jumper wire and/or the shield. Further, it is difficult to determine whether the circuit board having the conductive paste layer has good performance.

Figure 1A:
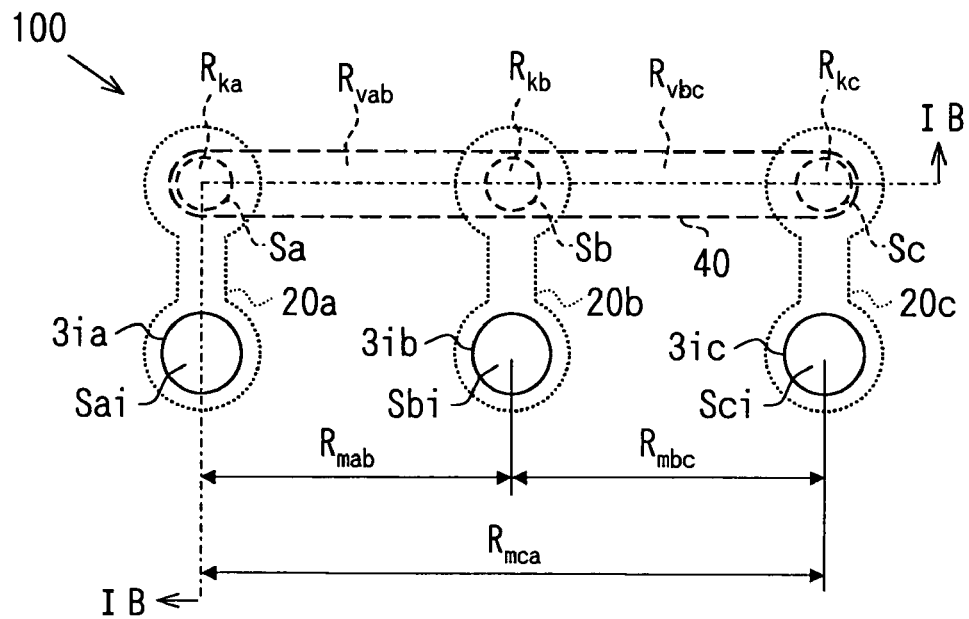
FIG. 1A is a plan view showing a part of a circuit board to explain a measurement method for a boundary resistance.
Figure 1B:
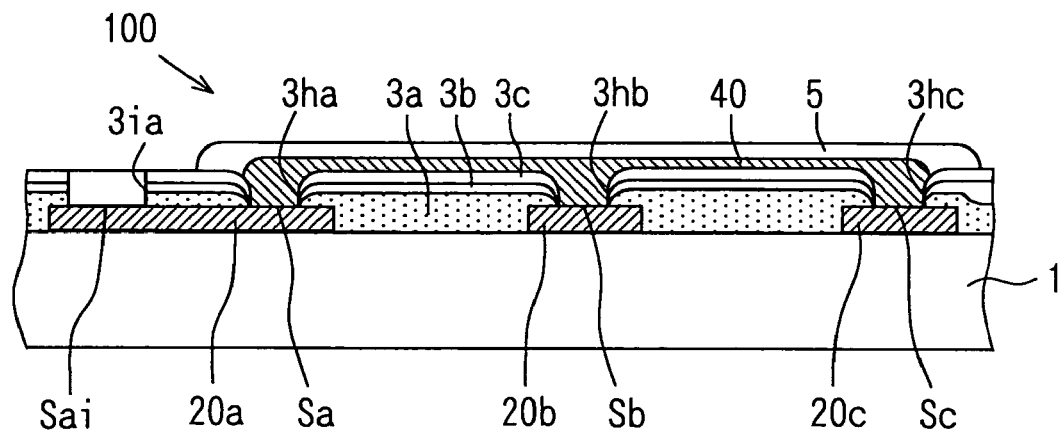
FIG. 1B is a cross sectional view showing the circuit board taken along line IB-IB in FIG. 1A, according to a first embodiment of the present invention.

In view of the above points, a circuit board 100 according to a first embodiment of the present invention is provided. The circuit board 100 is shown in FIGS. 1A and 1B. The circuit board 100 includes the insulation substrate 1, lower conductive patterns 20a-20c, the lower insulation layers 3a-3c as an interlayer insulation layer, a conductive paste layer 40 as a conductor, and the upper insulation layer 5 as a protection layer. The lower conductive patterns 20a-20c are formed on the surface of the insulation substrate 1 independently. The conductive paste layer 40 is an upper conductive layer. The conductive paste layer 40 can be made of other materials by other manufacturing method such as a sputtering method and a CVD method as long as the conductive paste layer 40 provides the conductor. In FIG. 1A, the lower insulation layers 3a-3c and the upper insulation layer 5 are not shown.

Each lower conductive pattern 20a-20c is made of copper foil having a thickness about 35 μm. The interlayer insulation layer 3a as a solder resist layer has a thickness in a range between 12 μm and 17 μm. The other two interlayer insulation layers 3b, 3c as an under coat layer for isolating the conductive pattern 20b from the other two conductive patterns 20a, 20c have a thickness in a range between 12 μm and 17 μm.

Each interlayer insulation layer 3a-3c has the first opening 3ha-3hc so that the lower conductive pattern 20a-20c is partially exposed from the interlayer insulation layers 3a-3c through the first opening 3ha-3hc. The conductive paste layer 40 connects to the lower conductive patterns 20a-20c through the first openings 3ha-3hc. The conductive paste layer 40 is made of an Ag—Cu (i.e., silver and copper) mixed paste. The conductive paste layer 40 has a thickness in a range between 15 μm and 25 μm. The protection insulation layer 5 for protecting the circuit board 100 from migration and the like covers the conductive paste layer 40. The protection insulation layer 5 as the over coat layer has a thickness in a range between 12 μm and 17 μm. The conductive paste layer 40 is covered with the interlayer insulation layers 3a-3c and the protection insulation layer 5 completely.

As shown in FIGS. 1A and 1B, the circuit board 100 includes a test coupon (i.e., a test piece) for measuring a boundary resistance of a connection between the lower conductive pattern 20a-20c and the conductive paste layer 40. Thus, the characteristics of the connection in the circuit board 100 are tested and determined by using the test coupon.

The test coupon in the circuit board 100 includes the conductive paste layer 40 connecting to each lower conductive pattern 20a-20c at a connection portion Sa-Sc, which is exposed from the interlayer insulation layers 3a-3c. The second opening 3ia-3ic is disposed near each connection portion Sa-Sc, respectively. In the second opening 3ia-3ic, no conductive paste layer 40 is disposed so that the lower conductive pattern 20a-20c is exposed from the interlayer insulation layers 3a-3c on the surface of the circuit board 100. Thus, lower conductive pattern 20a-20c is exposed on the surface of the circuit board 100. The lower conductive pattern 20a-20c at the second opening 3ia-3ic works as a resistance check land (i.e., a resistance measurement terminal) Sai-Sci for measuring a boundary resistance at the connecting portion Sa-Sc.

The boundary resistance of the connection portion Sb between the lower conductive pattern 20b and the conductive paste layer 40 is measured by using the test coupon of the circuit board 100 as follows. Here, the connection portion Sb is disposed at the center of the test coupon.

Firstly, three resistances between the resistance check lands Sai-Sci at the second openings $3ia$-$3ic$, which correspond to the connection portions Sa-Sc, are measured. Specifically, as shown in FIG. 1A, the resistance between the neighboring two lands Sai, Sbi corresponding to the connection portions Sa, Sb is defined as Rmab, and another resistance between the neighboring two lands Sbi, Sci corresponding to the connection portions Sb, Sc is defined as Rmbc. Further, the resistance between the lands Sai, Sci disposed on both ends of the test coupon is defined as Rmac.

The boundary resistances between the lower conductive patterns $20a$-$20c$ and the conductive paste layer 40 at the connection portions Sa-Sc are defined as Rka to Rkc. The resistance of the conductive paste layer 40 between the connection portions Sa, Sb is defined as Rvab, and the resistance of the conductive paste layer 40 between the connection portions Sb, Sc is defined as Rvbc. In this case, the following relationship shown in formulas F1-F3 is established.

$$Rmab = Rvab + Rka + Rkb \quad (F1)$$

$$Rmbc = Rvbc + Rkb + Rkc \quad (F3)$$

$$Rmca = Rvab + Rvbc + Rka + Rkc \quad (F3)$$

Here, the resistance of the lower conductive pattern $20a$-$20c$ is negligible small, compared with the boundary resistance Rka-Rkc at the connection portion Sa-Sc and the resistance Rvab, Rvbc of the conductive paste layer 40. Therefore, the resistance of the lower conductive pattern $20a$-$20c$ is not shown in formulas F1-F3.

By calculating the formula F1 plus the formula F2 minus the formula F3, the following formula F4 is obtained.

$$Rkb = (Rmab + Rmbc - Rmca)/2 \quad (F4)$$

Thus, the boundary resistance Rkb at the center connection portion Sb is calculated by measuring the resistances Rmab, Rmbc, Rmca between the resistance check lands Sai-Sci. In this way, by using the resistance check lands Sai-Sci, the boundary resistance Rkb at the connection portion Sb between the conductive paste layer 40 and the lower conductive pattern 20b can be measured even though the conductive paste layer 40 is completely covered with the protection insulation layer 5 to protect the conductive paste layer 40 as an upper conductive layer.

The above method for measuring the boundary resistance in the circuit board 100 can be generalized as follows in a case where the circuit board 100 includes three or more independent lower conductive patterns and an independent upper conductive layer connecting to each lower conductive pattern at a connection portion through an interlayer insulation layer. Here, the circuit board 100 includes N lower conductive patterns. The number N represents 3, 4, 5, . . . Further, the circuit board includes N connection portions. A set of three neighboring connection portions Sa-Sc among the N connection portions is selected out of the N connection portions. By performing the above method, the boundary resistance Rkb between the lower conductive pattern and the upper conductive layer at the center connection portion can be measured. Accordingly, by repeating the measurement of the boundary resistance Rkb from one end of the upper conductive layer to the other end of the upper conductive layer, the boundary resistances of the connection portions disposed in the middle portion of the circuit board 100 can be measured. Specifically, (N−2) connection portions except for two connection portions disposed on both ends of the circuit board 100 can be measured.

In the above method, the test coupon of the circuit board 100 is composed of three or more independent lower conductive patterns and the independent upper conductive layer connecting to each lower conductive pattern at the connection portion through the interlayer insulation layer. The lower conductive patterns correspond to the lower conductive patterns $20a$-$20c$, the upper conductive layer corresponds to the conductive paste layer 40, and the interlayer insulation layer corresponds to the interlayer insulation layers $3a$-$3c$. The test coupon further includes the second openings $3ia$-$3ic$ and the resistance check lands Sai-Sci.

The test coupon of the circuit board 100 can be positioned at any position. Specifically, the test coupon can be positioned at a space of the circuit board 100. Therefore, the boundary resistance at the connection portion between the upper conductive layer and the lower conductive pattern can be measured without reducing the degree of design freedom of the circuit board 100.

Thus, the circuit board 100 having the conductive paste layer 40, which is capable of evaluating characteristics of the conductive paste layer 40 and determining a performance of the circuit board 100, is provided by using the above described test coupon.

In the circuit board 100 having the conductive paste layer 40 for connecting between the lower conductive patterns $20a$-$20c$, the manufacturing cost of the circuit board 100 is low since the conductive paste is used. However, the boundary resistance Rka-Rkc at the connection portion Sa-Sc between the conductive paste layer 40 and the lower conductive pattern $20a$-$20c$ is easily changed according to the surface state such as surface morphology of the lower conductive pattern $20a$-$20c$ and/or the printing condition of the conductive paste layer 40. Thus, the above method can perform to evaluate the characteristics of the conductive paste layer 40 and to determine the performance of the circuit board 100. Therefore, the circuit board 100 having high performance can be selected easily.

Although the circuit board 100 has the conductive paste layer 40 made of conductive paste, the circuit board 100 can have an upper conductive layer made of bonding wire, solder, or the like.

Second Embodiment

Figure 2A:
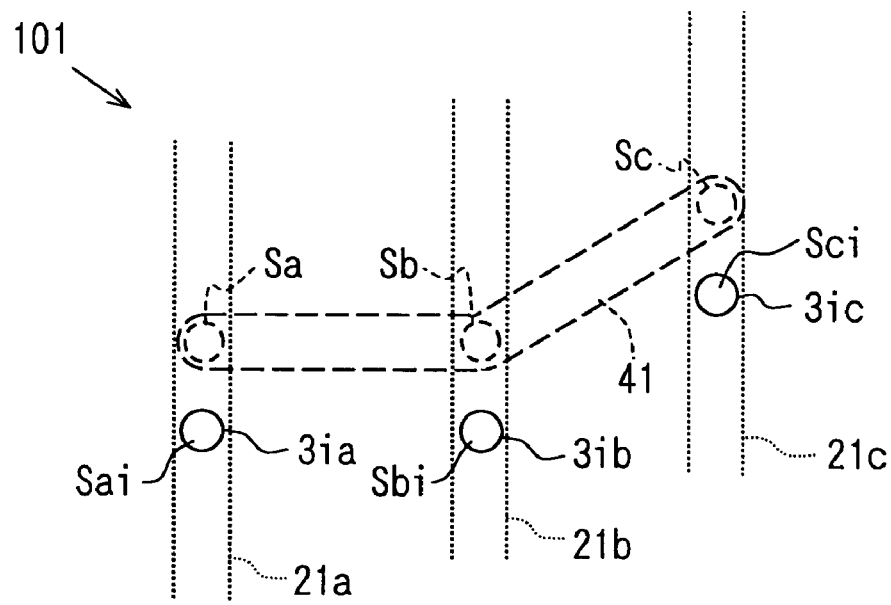
FIGS. 2A and 2B are plan views showing parts of circuit boards according to a second embodiment of the present invention.
Figure 2B:
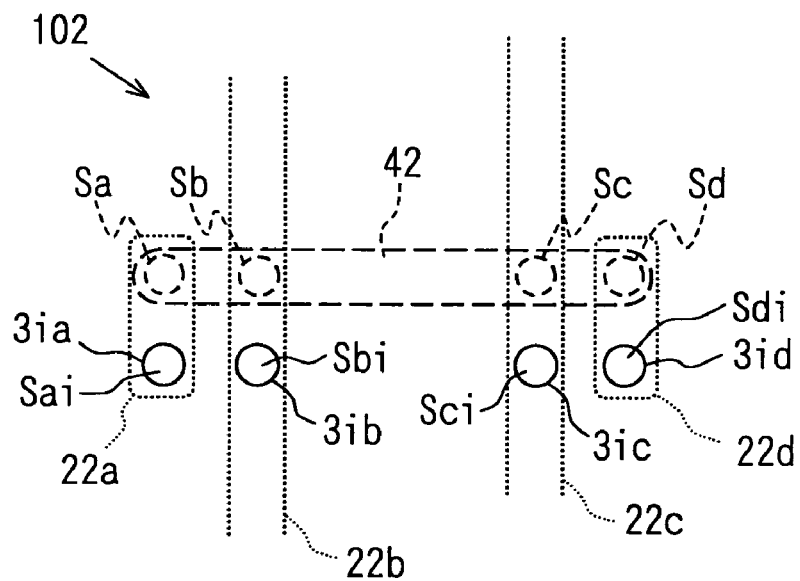

Circuit boards 101, 102 according to a second embodiment of the present invention are shown in FIGS. 2A and 2B.

FIG. 2A shows the circuit board 101 including three lower conductive patterns $21a$-$21c$ before an electric device is mounted on the circuit board 101. The lower conductive patterns $21a$-$21c$ are not connected together except for the connection portions Sa-Sc so that each lower conductive pattern $21a$-$21c$ is independent each other. A conductive paste layer 41 as an upper conductive layer connects to each lower conductive pattern $21a$-$21c$ at a connection portion Sa-Sc through the interlayer insulation layer $3a$-$3c$ (not shown). Accordingly, the conductive paste layer 41 becomes a jumper wire for connecting among the three lower conductive patterns $21a$-$21c$. Each lower conductive pattern $21a$-$21c$ exposed through the opening $3ia$-$3ic$ works as the resistance check land Sai-Sci corresponding to the connection portion Sa-Sc.

In the circuit board 101, the boundary resistance Rkb at the center connection portion Sb can be measured by the boundary resistance measuring method described in the first embodiment. Thus, by using the resistance check lands Sai-Sci, the boundary resistance Rkb at the connection portion Sb between the conductive paste layer 41 and the lower conductive pattern 21b can be measured even though the conductive paste layer 41 is completely covered with the protection insulation layer 5 to protect the conductive paste layer 41 as an upper conductive layer.

Thus, the circuit board 101 having the conductive paste layer 41, which is capable of evaluating characteristics of the conductive paste layer 41 and determining a performance of the circuit board 101, is provided by using the above described measuring method.

FIG. 2B shows the circuit board 102 including four lower conductive patterns 22a-22d, four connection portions Sa-Sd, four resistance check lands Sai-Sdi. Specifically, two lower conductive patterns 22b, 22c are independently disposed in an electric circuit on the circuit board 102. A conductive paste layer 42 as a jumper wire connects between the lower conductive patterns 22b, 22c through the insulation layers 3a-3c (not shown). The other two lower conductive patterns 22a, 22d disposed on both sides of the lower conductive patterns 22b, 22c are additional conductive patterns only for measuring the boundary resistances at the connection portions Sb, Sc between the conductive paste layer 41 and the lower conductive patterns 22b, 22c. The lower conductive patterns 22a-22d exposed through the opening 3ia-3id are the resistance check lands Sai-Sdi corresponding to the connection portions Sa-Sd.

In the circuit board 102, the conductive paste layer 42 as the independent upper conductive layer connects to each lower conductive pattern 22a-22d at the connection portion Sa-Sd through the interlayer insulation layers 3a-3c (not shown). In this case, two boundary resistances Rkb, Rkc between the lower conductive patterns 22b, 22c and the conductive paste layer 41 at two connection portions Sb, Sc can be measured by the boundary resistance measuring method. The connection portions Sb, Sc are disposed in the middle of the test coupon on the circuit board 102. Thus, by adding the additional lower conductive patterns 22a, 22d near the jumper wire disposed on both sides of the jumper wire, the lower conductive patterns 22b, 22c can be evaluated. Therefore, by using this method of adding the additional lower conductive patterns 22a, 22d, all of the boundary resistance at the connection portions can be evaluated. For example, in the circuit board 101, two additional lower conductive patterns can be formed on both sides of the lower conductive patterns 21a, 21c so that the boundary resistance Rka, Rkc at the connection portions Sa, Sc are measured.

Further, the conductive paste layer 41, 42 shown in FIGS. 2A and 2B can be used not only for the jumper wire but also for the shield. Here, it is required for the conductive paste layer 41, 42 using for the jumper wire to have high performance, compared with the conductive paste layer 41, 42 using for the shield. Therefore, a precise determination for evaluating the conductive paste layer 41, 42 as the jumper wire is necessitated. Thus, by the above method shown in FIG. 2B, the boundary resistance Rkb, Rkc at the connection portion Sb, Sc can be measured precisely so that the evaluation of the circuit board 102 is performed. In the method shown in FIG. 2B, the circuit board 102 includes the upper conductive layer 42 as the jumper wire connecting between two lower conductive patterns 22b, 22c.

Thus, the above method can perform to evaluate the characteristics of the conductive paste layer 40 and to determine the performance of the circuit board 101, 102 even though the conductive paste layer 40 is completely covered with the lower insulation layers 3a-3c and the upper insulation layer 5.

Third Embodiment

Figure 3:
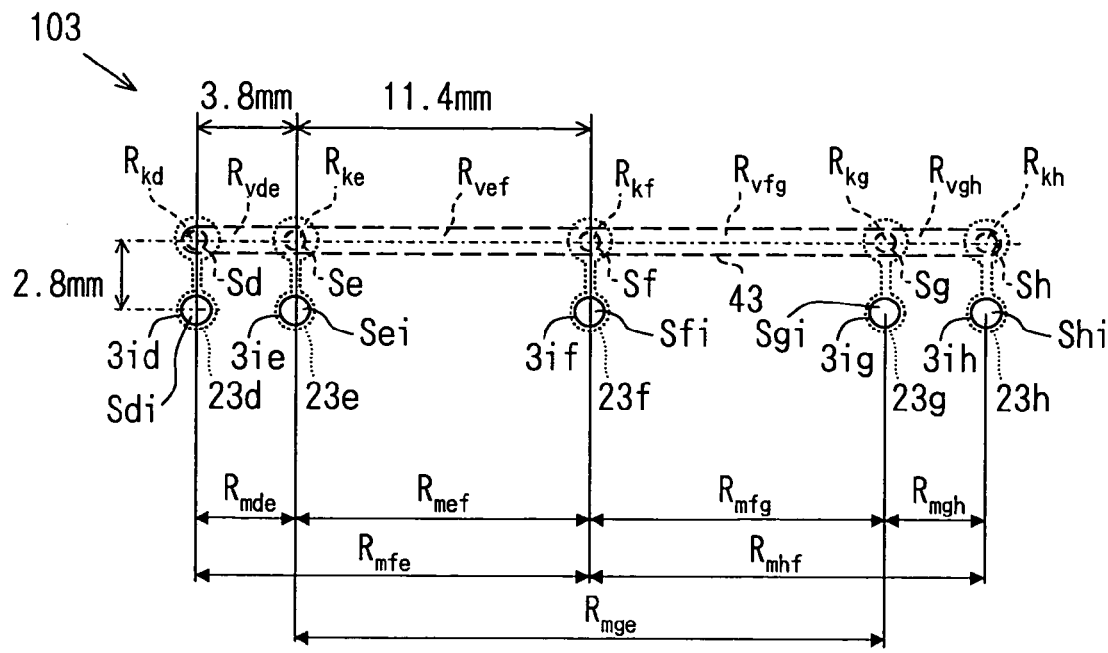
FIG. 3 is a plan view showing a part of a circuit board according to a third embodiment of the present invention.

A circuit board 103 according to a third embodiment of the present invention is shown in FIG. 3. In the circuit board 103, an independent conductive paste layer 43 as the upper conductive layer connects to each of five lower conductive patterns 23d-23h at the connection portion Sd-Sh. The lower conductive pattern 23d-23h exposed through an opening 3id-3ih works as the resistance check land Sdi-Shi corresponding to the connection portion Sd-Sh.

Although only the boundary resistance Rkb at the connection portion Sb between the lower conductive pattern 20b and the conductive paste layer 40 is obtained in the circuit board 100, not only the boundary resistances Rke-Rkg at the middle connection portions Se-Sg between the lower conductive pattern 23e-23g and the conductive paste layer 43 but also the resistance of the conductive paste layer 43 itself are obtained at the same time in the circuit board 103. The boundary resistances Rke-Rkg and the resistance of the conductive paste layer 43 are measured as follows.

Firstly, three sets of three neighboring connection portions among five connection portions Sd-Sh are selected so that seven resistances Rmde, Rmef, Rmfg, Rmgh, Rmhf, Rmge, Rmfd between two of the resistance check lands Sdi-Shi are measured. Accordingly, the boundary resistances Rke, Rkf, Rkg at the connection portions Se-Sg between the lower conductive patterns 23e-23g and the conductive paste layer 43 are calculated by the above described method. Here, the resistance of the conductive paste layer 43 between the connection portions Se, Sf is defined as Rvef, and the resistance of the conductive paste layer 43 between the connection portions Sf, Sg is defined as Rvfg. The resistances Rvef, Rvfg are satisfied with the following relationships.

$$Rvef = Rmef - Rke - Rkf \qquad (F5)$$

$$Rvfg = Rmfg - Rkf - Rkg \qquad (F6)$$

Thus, the resistances Rvef, Rvfg are obtained from the above formulas F5, F6.

The above method for evaluating the connection portion Se-Sg and the conductive paste layer 43 can be generalized as follows in a case where a circuit board includes four or more independent lower conductive patterns and an independent upper conductive layer connecting to each lower conductive pattern at a connection portion through an interlayer insulation layer. Here, the circuit board includes N lower conductive patterns. The number N represents 4, 5, 6, . . . Further, the circuit board includes N connection portions. A set of four neighboring connection portions Sd-Sg among the N connection portions is selected out of the N connection portions. By performing the above method, the boundary resistance Rke, Rkf between the lower conductive pattern and the upper conductive layer at the middle connection portions Se, Sf can be measured. Next, by using the formula F5, the resistance Rvef of the upper conductive layer between the connection portions Se, Sf is obtained at the same time. Here, the resistance Rmef is the measured resistance between the resistance check lands Sei, Sfi corresponding to the neighboring connection portions Se, Sf, which are disposed in the middle of the circuit board 103.

Accordingly, by repeating the measurement of the boundary resistances Rke, Rkf and the resistance Rvef from one end of the upper conductive layer to the other end of the upper conductive layer, the boundary resistances of the connection portions disposed in the middle portion of the circuit board can be measured. Further, the resistances of parts of the upper conductive layer between two neighboring connection portions disposed in the middle of the circuit board are obtained. Specifically, (N−2) connection portions except for two connection portions disposed on both ends of the circuit board can be evaluated. Further, (N−3) parts of the upper conductive layer between the neighboring connection portions disposed in the middle of the circuit board are evaluated.

Thus, the circuit board 103 having the conductive paste layer 43, which is capable of evaluating characteristics of the conductive paste layer 43 and determining a performance of the circuit board 103, is provided by using the above described measuring method.

Although the circuit board 103 has the construction shown in FIG. 3, the circuit board 103 can have another construction such as a construction shown in FIG. 2B.

Fourth Embodiment

Figure 4:
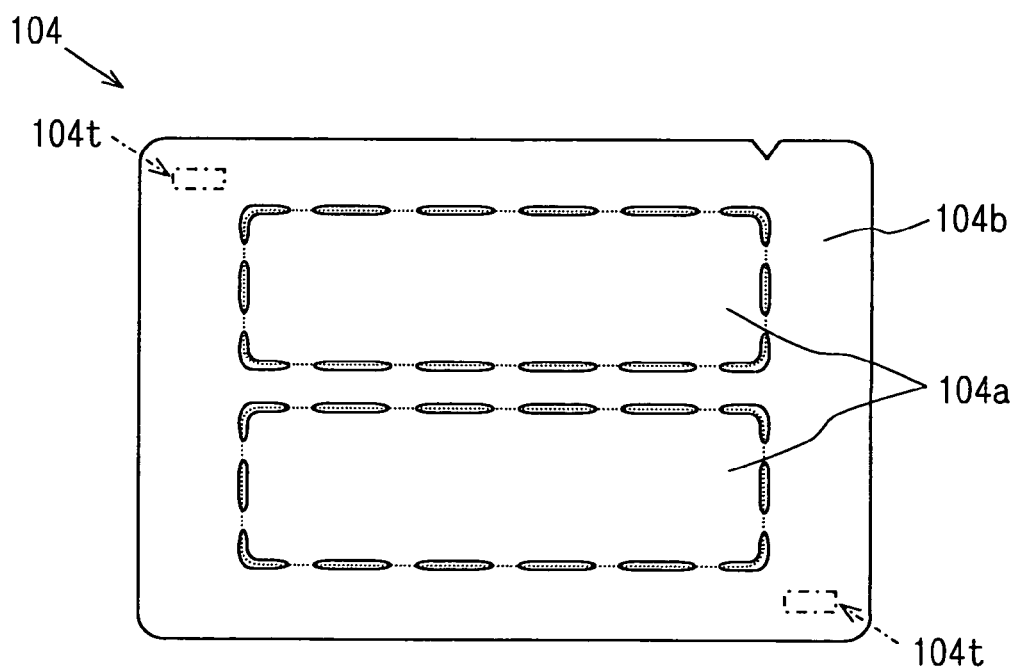
FIG. 4 is a plan view showing a circuit board according to a fourth embodiment of the present invention.

A circuit board 104 according to a fourth embodiment of the present invention is shown in FIG. 4. The circuit board 104 includes a product part 104a and a frame 104b. The product part 104a is cut along with a broken line shown in FIG. 4 so that the product part 104a provides a product. The frame 104b supports the product part 104a. The circuit board 104 further includes a test coupon 104t disposed in the frame 104b. Thus, since the test coupon 104t is disposed in the frame 104b, the whole area of the product part 104a can be used for mounting electric parts. In the circuit board 104, by using the test coupon 104t, the boundary resistances at the connection portions between the upper conductive layer and the lower conductive patterns can be measured. Further, since the product part 104a has no test coupon 104t, multiple electric circuits are mounted with high density on the surface of the product part 104a of the circuit board 104. Although the test coupon 104t is formed in the frame 104b, the test coupon 104t can be formed in the product part 104a.

The circuit board 104, i.e., the product part 104a having the conductive paste layer 43 is evaluated by the test coupon 104t. After that, the product part 104a is removed from the circuit board 104 so that the product is formed.

Fifth Embodiment

Figure 5A:
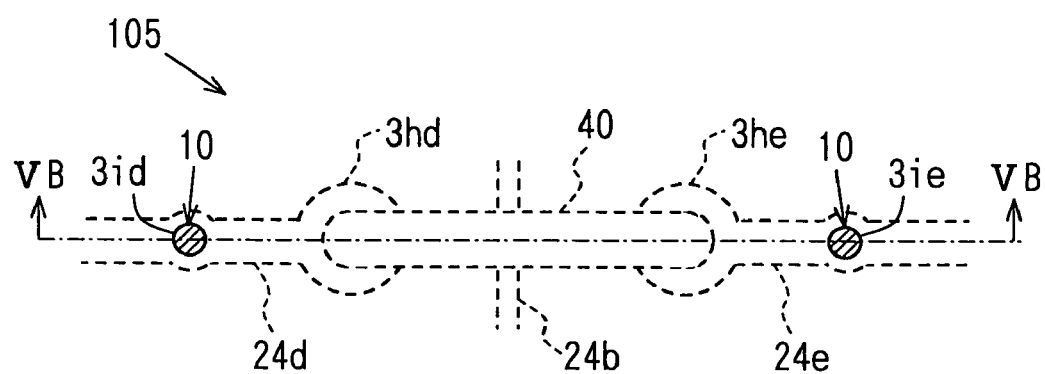
FIG. 5A is a plan view showing a part of a circuit board.
Figure 5B:
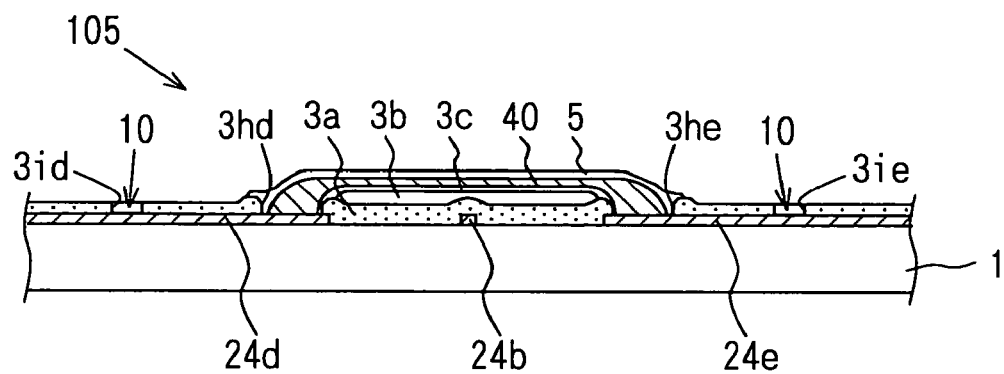
FIG. 5B is a cross sectional view showing the circuit board taken along line VB-VB in FIG. 5A, according to a fifth embodiment of the present invention.

A circuit board 105 according to a fifth embodiment of the present invention is shown in FIGS. 5A and 5B. The circuit board 105 includes the insulation substrate 1, a conductive patterns 24b, 24d, 24e, the lower insulation layers 3a-3c, the conductive paste layer 40, and the upper insulation layer 5. In FIG. 5A, the lower insulation layers 3a-3c and the upper insulation layer 5 are not shown.

The circuit board 105 includes the first openings 3hd, 3he and the second openings 3id, 3ie. Each lower conductive pattern 24d, 24e connects between the first and second openings 3hd, 3he, 3id, 3ie. At the first opening 3hd, 3he, the lower conductive pattern 24d, 24e is exposed from the lower insulation layers 3a-3c so that the exposed lower conductive pattern 24d, 24e connects to the conductive paste layer 40 as the jumper wire. At the second opening 3id, 3ie, the lower conductive pattern 24d, 24e is exposed from the lower insulation layers 3a-3c on the surface of the circuit board 105 without connecting to the conductive paste layer 40 as the jumper wire. The exposed lower conductive pattern 24d, 24e at the second opening 3id, 3ie is used for evaluating the characteristics of the conductive paste layer 40. Specifically, a resistance measurement terminal 10 is formed in the second opening 3id, 3ie for measuring the resistance of the conductive paste layer 40.

Figure 6A:
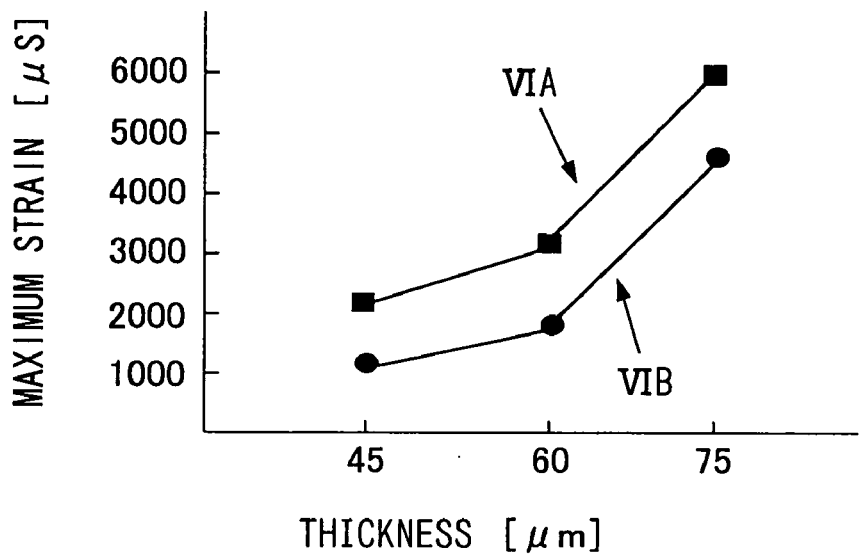
FIG. 6A is a graph showing a relationship between a maximum strain and a total thickness of lower insulation layers in the circuit board.

Here, a durability performance of the conductive paste layer 40 is determined by, for example, the thickness of each of the lower insulation layers 3a-3c, the conductive paste layer 40 and the upper insulation layer 5. Therefore, the influence of the thickness to the durability performance has been studied. Specifically, a relationship between the total thickness of the lower insulation layers 3a-3c and the maximum strain generated in the conductive paste layer 40 has been studied. The result of the relationship is shown in FIG. 6A. In the above study, a cooling-heating cycle is applied to the circuit board 105. Specifically, the circuit board is heated and cooled in a range between −30° C. and 80° C. repeatedly. The strain generated in the conductive paste layer 40 is obtained by a FEM analysis (i.e., a finite element method analysis). FIG. 6A is a graph showing a relationship between the maximum strain as a micro strain in the conductive paste layer 40 and the total thickness of the lower insulation layers 3a-3c. A unit of a vertical axis in FIG. 6A is μS (i.e., micro strain). A curve VIA represents the circuit board 105 with the conductive paste layer 40 having a thickness of 15 μm, and another curve VIB represents the circuit board 105 with the conductive paste layer 40 having a thickness of 20 μm. As shown in FIG. 6A, the maximum strain in the conductive paste layer 40 becomes larger as the total thickness of the lower insulation layers 3a-3c becomes thicker and as the thickness of the conductive paste layer 40 becomes thinner.

Figure 6B:
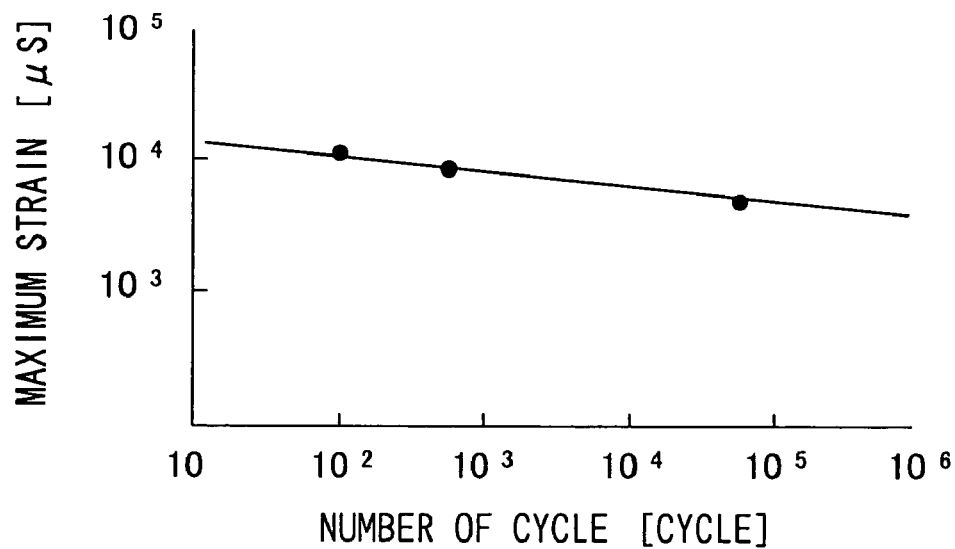
FIG. 6B is a graph showing a relationship between the maximum strain and the number of cycles, according to the fifth embodiment.

FIG. 6B is a graph showing a relationship between the maximum strain in the conductive paste layer 40 and the number of cycles of repeating the stress applied to the circuit board 105. A unit of a vertical axis in FIG. 6A is μS (i.e., micro strain). Therefore, FIG. 6B shows a life time of the circuit board 105 when the stress is repeatedly applied to the circuit board 105. Here, the circuit board 105 is tested under a condition of a bending strength test described in JIS C-6481 (i.e., Japanese Industrial Standards code No. C-6481). Specifically, a predetermined repeating stress is applied to the conductive paste layer 40 so that a repeating strain is generated in the conductive paste layer 40. The number of cycles of the applied stress is measured until the circuit board 105 is cracked. As shown in FIG. 6B, the life time of the circuit board 105 becomes longer as the strain in the conductive paste layer 40 become smaller.

Thus, the stress applied to the conductive paste layer 40 affects the life time of the circuit board 105. Specifically, the strain in the conductive paste layer 40 affects the durability performance of the conductive paste layer 40. The stress applied to the conductive paste layer 40 depends on not only the thickness of the conductive paste layer 40 but also the thicknesses of the lower insulation layers 3a-3c and the upper insulation layer 5. The thickness of each of the conductive paste layer 40, the lower insulation layers 3a-3c and the upper insulation layer 5 has manufacturing variations when they are formed in the circuit board 105. Therefore, it is important to measure the thickness of each of the conductive paste layer 40, the lower insulation layers 3a-3c and the upper insulation layer 5. This is because the durability performance of the conductive paste layer 40 depends on the thicknesses. This is, by measuring the thicknesses, the durability performance of the conductive paste layer 40 is evaluated.

Figure 7A:
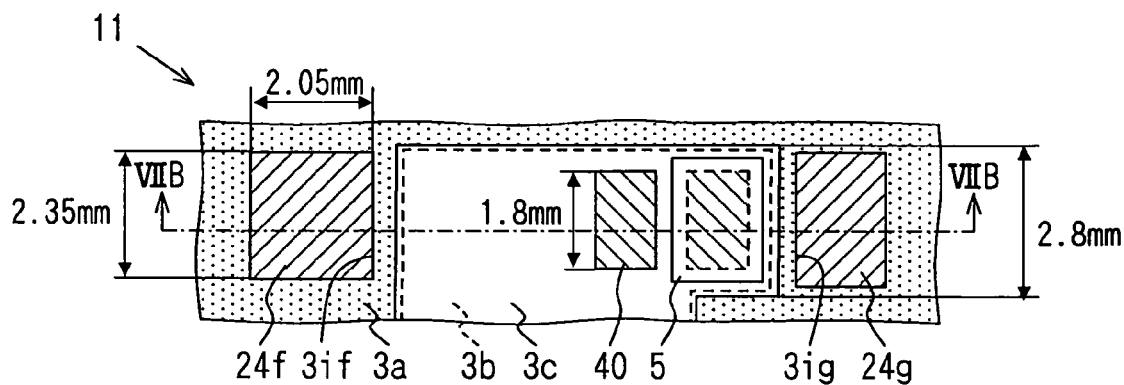
FIG. 7A is a plan view showing a thickness measurement test coupon of the circuit board.
Figure 7B:
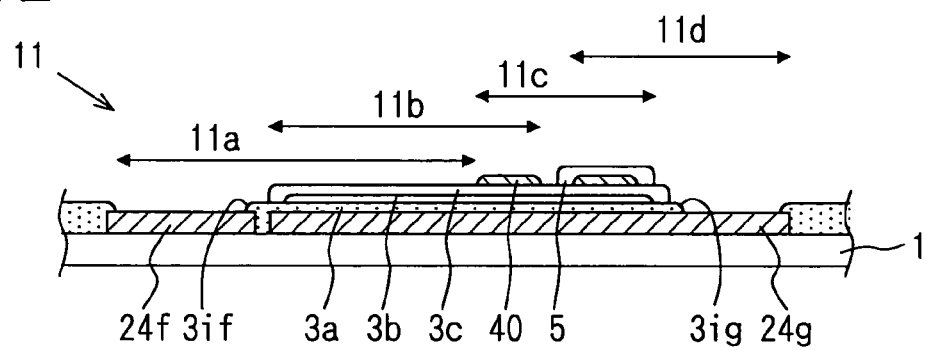
FIG. 7B is a cross sectional view showing the test coupon taken along line VIIB-VIIB in FIG. 7A.

To measure the thicknesses, a thickness measurement test coupon is added in the circuit board 105 for evaluating the characteristics of the conductive paste layer 40. One example of the thickness measurement test coupon 11 is shown in FIGS. 7A and 7B. Further, in FIG. 7C, a measurement result is shown.

The test coupon 11 includes four measurement parts 11a-11d. The first measurement part 11a includes the lower conductive pattern 24f and the lower insulation layers 3a-3c for measuring a step between the lower conductive pattern 24f and the lower insulation layer 3c. Specifically, the first measurement part of the test coupon 11 is used for measuring a height difference between the lower conductive pattern 24f exposed on the circuit board 105 through the opening 3if and the lower insulation layer 3c disposed on the surface of the circuit board 105. By measuring the step in the first measurement part 11a, the total thickness of the lower insulation layers 3a-3c disposed on the surface of the conductive pattern 24g can be measured. Here, the first measurement part can be composed of the insulation substrate 1 exposed on the surface of the circuit board 105 and the lower insulation layers 3a-3c so that the total thickness of the lower insulation layers 3a-3c is measured.

The second measurement part 11b includes the lower insulation layers 3a-3c and the conductive paste layer 40 for measuring a step between the lower insulation layer 3c exposed on the surface of the circuit board 105 and the conductive paste layer 40 exposed on the surface of the circuit board 105. By measuring the step in the second measurement part 11b, the thickness of the conductive paste layer 40 disposed on the surface of the lower insulation layer 3c can be measured.

The third measurement part 11c includes the conductive paste layer 40 and the upper insulation layer 5 for measuring a step between the conductive paste layer 40 exposed on the surface of the circuit board 105 and the upper insulation layer 5 exposed on the surface of the circuit board 105. By measuring the step in the third measurement part 11c, the thickness of the upper insulation layer disposed on the surface of the conductive paste layer 40 can be measured.

The fourth measurement part 11d includes the upper insulation layer 5 and the lower conductive pattern 24g for measuring a step between the upper insulation layer 5 exposed on the surface of the circuit board 105 and the lower conductive pattern 24g exposed on the surface of the circuit board 105 through the opening 3ig. By measuring the step in the fourth measurement part 11d, the height difference between the surface of the lower conductive pattern 24g and the surface of the upper insulation layer 5, which is the highest layer in the circuit board 105, can be measured. This height difference is necessitated for mounting an electric part on the lower conductive pattern 24g.

The test coupon 11 includes the lower conductive patterns 24f, 24g exposed on the surface of the circuit board 105 and disposed on both ends of the circuit board 105. This lower conductive patterns 24f, 24g are used for improving the accuracy of the thickness measurement as follows. When the thickness is measured on the basis of the measurement of the step, the measurement of the height becomes inaccurate as the measurement point is apart from the step in a case where the step as a reference inclines. The lower conductive patterns 24f, 24g made of metal film are formed comparatively flat. In the test coupon 11, the lower conductive patterns 24f, 24g are used as a reference of the measurement of the step. Therefore, the lower conductive patterns 54f, 24g exposed on the surface of the circuit board 105 are formed on both ends of the test coupon 11. Thus, a line connected between the surfaces of the lower conductive patterns 24f, 24g can be used as a height reference. By using this height reference, each step between the lower insulation layers 3a-3c, the conductive paste layer 40 and the upper insulation layer 5 can be measured with high accuracy. Although the line connected between the surfaces of the lower conductive patterns 24f, 24g is used as the height reference, the height reference can be provided by the insulation substrate disposed on both ends of the test coupon 11 and exposed on the surface of the circuit board 105 so that a line connected between the surfaces of the insulation substrate on both ends is used as the height reference.

Figure 7C:
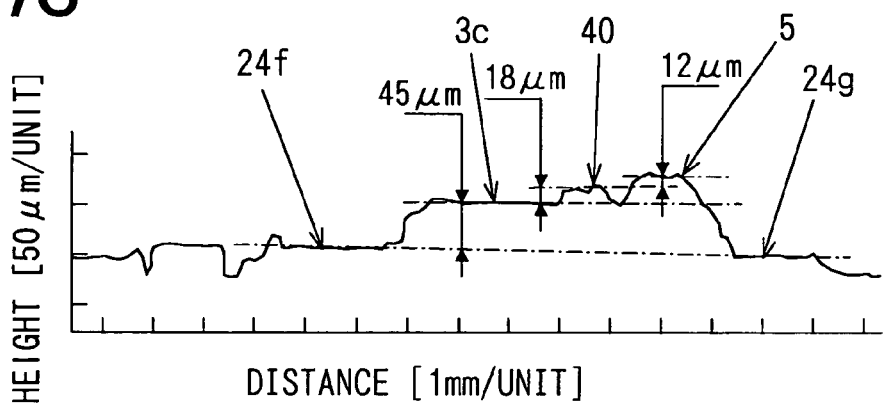
FIG. 7C is a graph showing a relationship between a height and a distance in the circuit board according to the fifth embodiment.

FIG. 7C shows the result of the measurement of the height in the circuit board 105. By using the result, the thicknesses of the lower insulation layers 3a-3c, the conductive paste layer 40 and the upper insulation layer 5 are obtained. The height measurement shown in FIG. 7C is performed by a surface roughness gauge. In FIG. 7C, the total thickness of the lower insulation layers 3a-3c is 45 μm, the thickness of the conductive paste layer 40 is 18 μm, and the thickness of the upper insulation layer 5 is 12 μm.

Thus, the thickness of each of the lower insulation layers 3a-3c, the conductive paste layer 40 and the upper insulation layer 5 are measured by using the test coupon 11. Further, by using the thickness measurement result, and by using the relationship between the strain in the conductive paste layer 40 and the durability performance shown in FIGS. 6A and 6B, the durability performance of the conductive paste layer 40 can be evaluated. Accordingly, the performance of the circuit board 105 can be determined on the basis of the thickness measurement result by using the test coupon 11.

In the circuit board 105, the resistance measurement terminal 10 is exposed on the surface of the circuit board 105 through the second opening 3id, 3ie so that the conductive pattern 24d, 24e is exposed from the lower insulation layers 3a-3c. However, the terminal 10 can be provided by forming the lower insulation layers 3a-3c on the substrate 1 except for a certain part near the first opening 3hd, 3he so that the conductive pattern 24d, 24e is partially exposed from the lower insulation layers 3a-3c. Thus, the certain part, on which the lower insulation layers 3a-3c are not formed, provides the terminal 10.

The test coupon 11 includes four measurement parts 11a-11d to measure the thicknesses of the lower insulation layers 3a-3c, the conductive paste layer 40 and the upper insulation layer 5. However, the test coupon 11 can be used for measuring at least one of the thicknesses of the lower insulation layers 3a-3c, the conductive paste layer 40 and the upper insulation layer 5. Further, the test coupon 11 can be used for measuring any two of the thicknesses of the lower insulation layers 3a-3c, the conductive paste layer 40 and the upper insulation layer 5.

Sixth Embodiment

Figure 8:
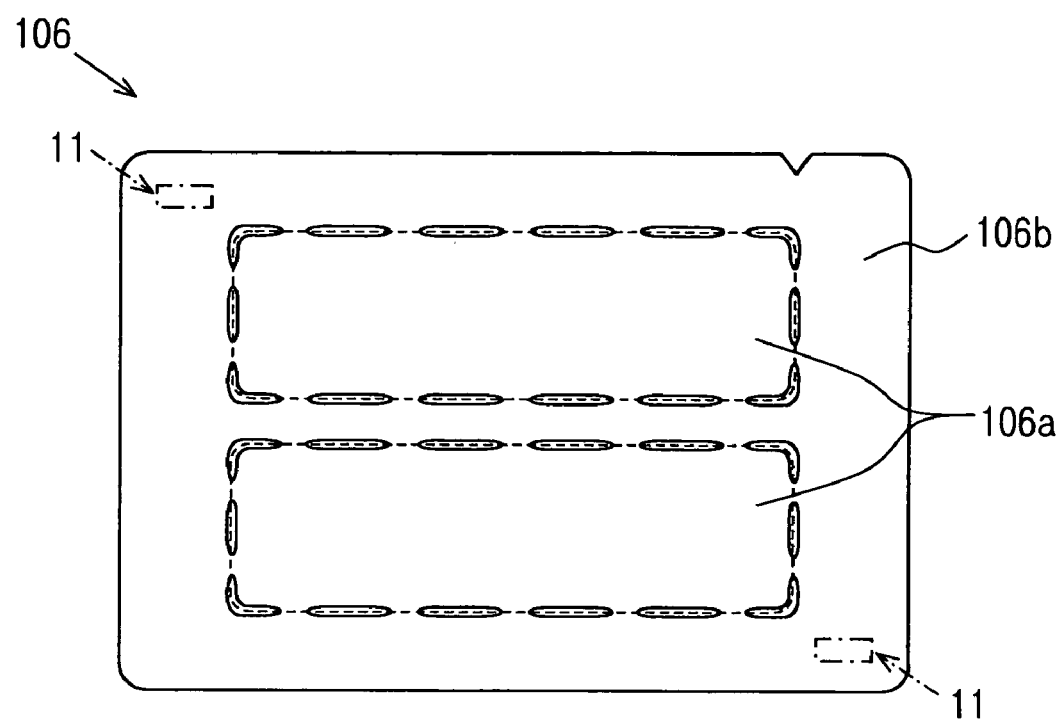
FIG. 8 is a plan view showing a circuit board according to a sixth embodiment of the present invention.

A circuit board 106 according to a sixth embodiment of the present invention is shown in FIG. 8. The circuit board 106 includes a product part 106a and a frame 106b. The product part 106a is cut along with a broken line shown in FIG. 8 so that the product part 106a provides a product. The frame 106b supports the product part 106a. The circuit board 106 further includes a test coupon 11 disposed in the frame 106b. Thus, since the test coupon 11 is disposed in the frame 106b, the whole area of the product part 106a can be used for electric parts. In the circuit board 106, by using the test coupon 11, the thickness of each of the lower insulation layers 3a-3c, the conductive paste layer 40 and the upper insulation layer 5 are measured by using the test coupon 11 so that the durability performance of the conductive paste layer 40 can be evaluated. Further, since the product part 106a has no test coupon 11, multiple electric circuits are mounted on the surface of the product part 106a of the circuit board 106 with high density. Although the test coupon 11 is formed in the frame 106b, the test coupon 11 can be formed in the product part 106a.

Seventh Embodiment

The thickness measurement test coupon 11 is used for measuring the thickness of the lower insulation layers 3a-3c, the conductive paste layer 40 and the upper insulation layer 5 as one of factors defining the characteristics of the durability performance of the conductive paste layer 40. However, another factor defining the durability performance of the conductive paste layer 40 is an adhesiveness of the conductive paste layer 40 on the lower conductive patterns 24d, 24e. The adhesiveness between the lower conductive patterns 24d, 24e and the conductive paste layer 40 affects the performance of the jumper wire or the shield provided by the conductive paste layer 40 and the durability performance of the conductive paste layer 40. Since the adhesiveness has manufacturing variations when the circuit board 105 is formed. Therefore, it is important to measure the adhesiveness. Thus, by measuring the adhesiveness, the durability performance of the conductive paste layer 40 is evaluated.

Figure 9A:
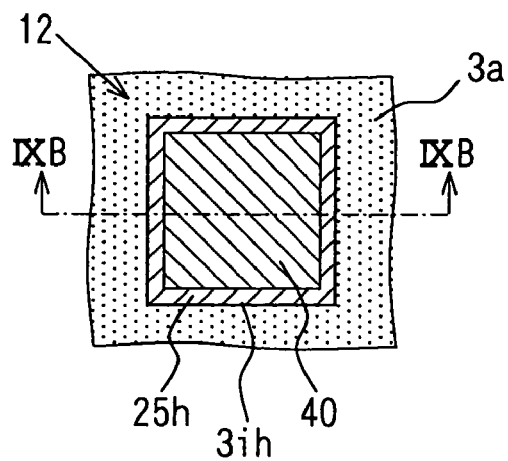
FIG. 9A is a plan view showing an adhesiveness measurement test coupon of a circuit board.
Figure 9B:
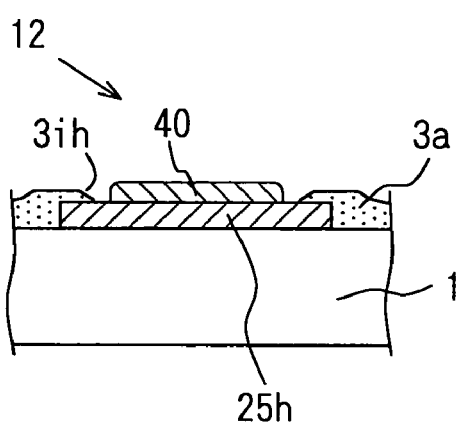
FIG. 9B is a cross sectional view showing the test coupon taken along line IXB-IXB in FIG. 9A, according to a seventh embodiment of the present invention.

To measure the adhesiveness, an adhesiveness measurement test coupon is added in the circuit board 105 for evaluating the characteristics of the conductive paste layer 40. One example of the adhesiveness measurement test coupon 12 is shown in FIGS. 9A and 9B.

The adhesiveness measurement test coupon 12 includes the lower conductive pattern 25h exposed through the opening 3ih and the conductive paste layer 4 exposed on the surface of the circuit board 105. The conductive paste layer 4 has dimensions of 10 millimeters square. Here, the circuit board 105 is tested under a condition of a peeling test described in JIS K-5600 (i.e., Japanese Industrial Standards code No. C-5600). In the peeling test, the circuit board 105 is formed into a grid, and then, a tape is bonded on the surface of the test coupon for testing the adhesiveness. Thus, the adhesiveness of the conductive paste layer 40 disposed on the lower conductive pattern 25h is measured. Accordingly, durability performance of the conductive paste layer 40 is evaluated so that the circuit board 105 is also evaluated.

Here, the adhesiveness measurement test coupon 12 can be disposed on the frame 106b shown in FIG. 8 in a case where the circuit board 105 is composed of the product part 106a and the frame 106b. In this case, the adhesiveness between the lower conductive pattern 25h and the conductive paste layer 40 can be measured by using the test coupon 12 so that the durability performance of the conductive paste layer 40 is evaluated. After that, when the product part 106a is cut from the circuit board 105, the product part 106a of the circuit board 105 can be a high density packaging circuit board.

Although the test coupon 12 includes the conductive pattern 25h exposed through the opening 3ih and the conductive paste layer 40 exposed on the surface of the circuit board 105 and disposed on the conductive pattern 25h, the test coupon 12 can be have the upper insulation layer 5 on the conductive paste layer 40.

Eighth Embodiment

Another factor defining the durability performance of the conductive paste layer 40 is an insulation performance of the lower insulation layers 3a-3c. The insulation performance of the lower insulation layers 3a-3c affects the performance of the jumper wire or the shield provided by the conductive paste layer 40 and the durability performance of the conductive paste layer 40. When the insulation performance of the lower insulation layers 3a-3c is not excellent, the conductive paste layer 40 as the jumper wire and the conductive pattern may be short, and/or the required shield performance cannot be obtained. Here, the insulation performance has manufacturing variations since resin material forming the lower insulation layers 3a-3c is not sufficiently hardened when the circuit board 105 is formed. Further, the insulation performance may be reduced. Therefore, it is important to measure the insulation performance of the lower insulation layers 3a-3c. Thus, by measuring the insulation performance, the durability performance of the conductive paste layer 40 is evaluated.

To measure the insulation performance, an insulation performance measurement test coupon is added in the circuit board 105 for evaluating the characteristics of the conductive paste layer 40. One example of the insulation performance measurement test coupons 13a, 13b is shown in FIGS. 10A to 10C.

Figure 10A:
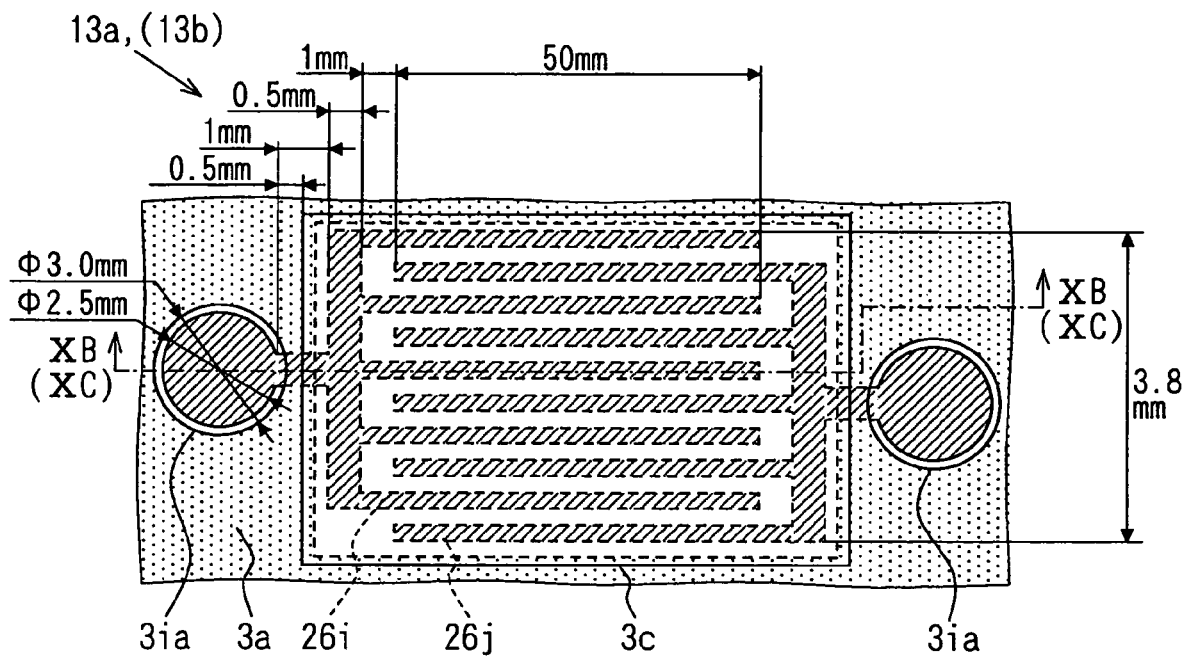
FIG. 10A is a plan view showing an insulation performance measurement test coupon of a circuit board.

As shown in FIG. 10A, each insulation performance measurement test coupons 13a, 13b includes a pair of conductive patterns 26i, 26j, the lower insulation layer 3b, 3c and the opening 3ia. The conductive pattern 26i has a comb-teeth shape, and the other conductive pattern 26j also has a comb-teeth shape, which faces the comb-teeth of the conductive pattern 26i. Specifically, a side of a tooth of the conductive pattern 26i faces a side of a tooth of the conductive pattern 26j. A width of each comb-tooth of the conductive pattern 26i, 26j is 0.2 mm. A distance between two neighboring comb-teeth, which face each other, is 0.2 mm. The lower insulation layers 3b, 3c cover a comb-teeth portion of the conductive pattern 26i, 26j.

Figure 10B:
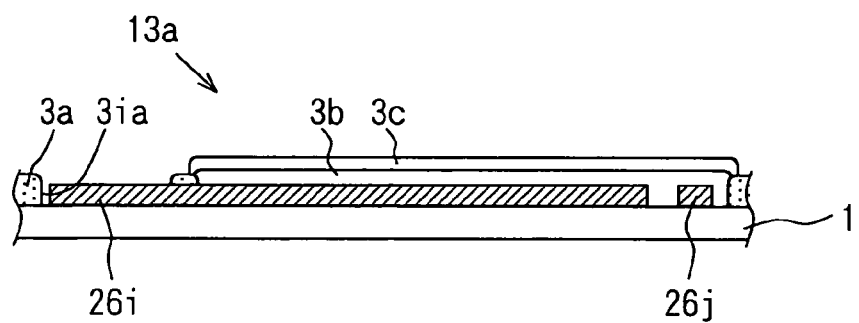
FIG. 10B is a cross sectional view showing one of the test coupons taken along line XB-XB in FIG. 10A.
Figure 10C:
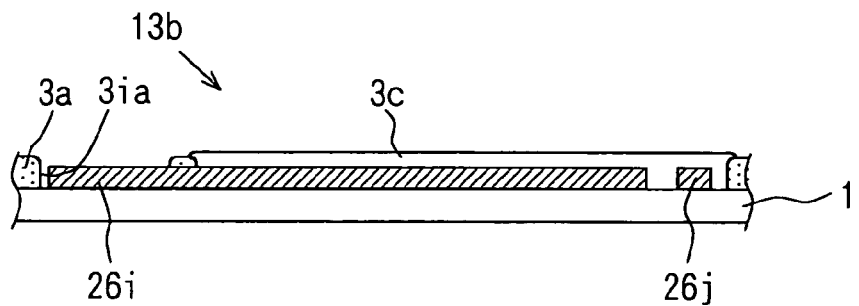
FIG. 10C is a cross sectional view showing the other one of the test coupons taken along line XC-XC in FIG. 10A, according to an eighth embodiment of the present invention.

In the test coupon 13a shown in FIGS. 10A and 10B, the conductive insulation layers 3b, 3c covering the comb-teeth portion includes the second lower insulation layer 3b and the third lower insulation layer 3c. In the test coupon 13b shown in FIGS. 10A and 10C, the conductive insulation layer 3c covering the comb-teeth portion includes only the third lower insulation layer 3c. Thus, two types of the test coupons are formed in the circuit board 105 so that the total insulation resistance of the second and third lower insulation layers 3b, 3c and the insulation resistance of the third lower insulation layer 3c are evaluated independently.

By using the test coupons 13a, 13b, the insulation resistance of the lower insulation layers 3b, 3c covering the comb-teeth portion of the conductive patterns 26i, 26j can be measured. In this case, the conductive patterns 26i, 26j exposed through the opening 3ia are used for a measurement terminal. Accordingly, the insulation resistance of the lower insulation layers 3b, 3c is measured so that the durability performance of the conductive paste layer 40 is evaluated. Further, the circuit board 105 is also evaluated.

Here, the insulation performance measurement test coupons 13a, 13b can be disposed on the frame 106b shown in FIG. 8 in a case where the circuit board 105 is composed of the product part 106a and the frame 106b. Since the test coupons 13a, 13b having comparatively large dimensions are disposed on the frame 106b, the product part 106a of the circuit board 105 can be a high density packaging circuit board.

Although the test coupons 13a, 13b are used for measuring the total insulation resistance of the second and third insulation layers 3b, 3c and for measuring the insulation resistance of the third lower insulation layer 3c only, only the first or the second insulation layer 3a, 3b can be formed on the comb-teeth portion in the test coupon 13a, 13b so that the test coupon 13a is used for measuring the insulation resistance of the first insulation layer 3a only, and the test coupon 13b is used for measuring the insulation resistance of the second insulation layer 3b only. Further, a three-layered laminated layer composing the first, second and third insulation layers 3a-3c are formed on the comb-teeth portion so that the test coupon 13a, 13b is provided.

Such changes and modifications are to be understood as being within the scope of the present invention as defined by the appended claims.

What is claimed is:

1. A circuit board comprising:
a substrate;
an unit conductive pattern disposed on a surface of the substrate;
a lower insulation layer disposed on the unit conductive pattern to cover the unit conductive pattern except for an unit opening, through which the unit conductive pattern is partially exposed from the lower insulation layer;
a conductor disposed on the lower insulation layer and connecting to the unit conductive pattern through the unit opening;
an upper insulation layer disposed on the conductor for covering the conductor and the lower insulation layer;
a test coupon disposed on the substrate for evaluating the conductor;
a product part to be cut from the circuit board; and
a frame for supporting the product part,
wherein the test coupon is disposed in the frame.

2. The circuit board according to claim 1,
wherein the unit conductive pattern includes a plurality of conductive patterns, and the unit opening includes a plurality of openings corresponding to the conductive patterns, respectively,
wherein the test coupon is a resistance measurement test coupon, which includes a plurality of resistance measurement terminals corresponding to the conductive patterns, respectively,
wherein the conductor connects to each conductive pattern at a connection portion through the opening,
wherein each conductive pattern is partially exposed on a surface of the circuit board from the lower and upper insulation layers so that the resistance measurement terminal is provided by the exposed conductive pattern, and
wherein each resistance measurement terminal is disposed near the connection portion.

3. The circuit board according to claim 2, wherein the conductor is a jumper wire for connecting between at least two conductive patterns.

4. The circuit board according to claim 1, wherein the conductor is made of a conductive paste layer.

5. The circuit board according to claim 1,
wherein the unit conductive pattern includes first to third conductive patterns, and the unit opening includes first to third openings corresponding to the first to third conductive patterns, respectively,
wherein the test coupon is a resistance measurement test coupon, which includes first to third resistance measurement terminals,
wherein the conductor connects to the first to third conductive patterns at first to third connection portions through the first to third openings,
wherein the first to third conductive patterns are partially exposed on the surface of the circuit board from the lower and upper insulation layers so that the first to third resistance measurement terminals are provided by the exposed first to third conductive patterns, respectively, and
wherein the first to third resistance measurement terminals are disposed near the first to third connection portions, respectively.

6. The circuit board according to claim 5, wherein the first to third connecting portions are aligned on the conductor in this order so that the first to third conductor patterns are also aligned on the substrate in this order.

7. The circuit board according to claim 6, wherein the test coupon is capable of measuring a resistance of the second connection portion between the conductor and the second conductive pattern.

8. The circuit board according to claim 5,
wherein the unit conductive pattern further includes a fourth conductive pattern, and the unit opening further includes a fourth opening corresponding to the fourth conductive pattern,
wherein the conductor connects to the fourth conductive pattern at a fourth connection portion through the fourth opening,
wherein the test coupon further includes a fourth resistance measurement terminal,
wherein the fourth conductive pattern is partially exposed on the surface of the circuit board from the lower and upper insulation layers so that the fourth resistance measurement terminal is provided by the exposed fourth conductive pattern, and
wherein the fourth resistance measurement terminal is disposed near the fourth connection portion.

9. The circuit board according to claim 8,
wherein the first to fourth connecting portions are aligned on the conductor in this order so that the first to fourth conductor patterns are also aligned on the substrate in this order.

10. The circuit board according to claim 9,
wherein the test coupon is capable of measuring resistances of the second and third connection portions and a resistance of the conductor disposed between the second and third connection portions.

11. The circuit board according to claim 5,
wherein the first to third conductive patterns are made of copper foil disposed on the surface of the substrate.

12. The circuit board according to claim 5,
wherein the test coupon further includes the first to third conductive patterns and the conductor.

13. The circuit board according to claim 1, further comprising:
a plurality of unit conductive patterns; and
a plurality of unit openings corresponding to the unit conductive patterns,
wherein the conductor is a jumper wire for connecting between the unit conductive patterns at connection portions through the unit openings,
wherein the test coupon includes a plurality of resistance measurement terminals,
wherein each unit conductive pattern is partially exposed on the surface of the circuit board from the lower and upper insulation layers so that the exposed unit conductive pattern provides the resistance measurement terminal, and
wherein each resistance measurement terminal is disposed near the connection portion.

14. The circuit board according to claim 13,
wherein the connecting portions are aligned on the conductor so that the unit conductor patterns corresponding to the connection portions are aligned on the substrate in the same order as the corresponding connection portions.

15. The circuit board according to claim 14, wherein the test coupon is capable of measuring resistances of the connection portions disposed in a middle of the aligned connection portions.

16. The circuit board according to claim 13, wherein the unit openings are first type openings, wherein each unit conductive pattern connects to the jumper wire through the first type opening, wherein each unit conductive pattern is exposed on the surface of the circuit board from the lower and upper insulation layers through a second type opening, and wherein the resistance measurement terminal is provided by the exposed unit conductive patterns exposed through the second openings disposed near the first openings.

17. A circuit board comprising:
a substrate;
an unit conductive pattern disposed on a surface of the substrate;
a lower insulation layer disposed on the unit conductive pattern to cover the unit conductive pattern except for an unit opening, through which the unit conductive pattern is partially exposed from the lower insulation layer;
a conductor disposed on the lower insulation layer and connecting to the unit conductive pattern through the unit opening;
an upper insulation layer disposed on the conductor for covering the conductor and the lower insulation layer;
a test coupon disposed on the substrate for evaluating the conductor;
a product part to be cut from the circuit board; and
a frame for supporting the product part,
wherein the test coupon is disposed in the frame,
wherein the test coupon is a thickness measurement test coupon for measuring a thickness of at least one of the lower insulation layer, the conductor, and the upper insulation layer.

18. The circuit board according to claim 17, wherein the test coupon includes a portion for measuring a step between the substrate and the lower insulation layer, which are exposed on the surface of the circuit board.

19. The circuit board according to claim 17, wherein the test coupon includes a portion for measuring a step between the unit conductive pattern and the lower insulation layer, which are exposed on the surface of the circuit board.

20. The circuit board according to claim 17, wherein the test coupon includes a portion for measuring a step between the lower insulation layer and the conductor, which are exposed on the surface of the circuit board.

21. The circuit board according to claim 17, wherein the test coupon includes a portion for measuring a step between the conductor and the upper insulation layer, which are exposed on the surface of the circuit board.

22. The circuit board according to claim 17, wherein the test coupon includes a portion for measuring a step between the unit conductive pattern and the upper insulation layer, which are exposed on the surface of the circuit board.

23. The circuit board according to claim 17, wherein the test coupon further includes two parts of the substrate disposed on both ends of the test coupon and exposed on the surface of the circuit board.

24. The circuit board according to claim 17, wherein the test coupon further includes two parts of the unit conductive pattern disposed on both ends of the test coupon and exposed on the surface of the circuit board.

25. A circuit board comprising:
a substrate;
an unit conductive pattern disposed on a surface of the substrate;
a lower insulation layer disposed on the unit conductive pattern to cover the unit conductive pattern except for an unit opening, through which the unit conductive pattern is partially exposed from the lower insulation layer;
a conductor disposed on the lower insulation layer and connecting to the unit conductive pattern through the unit opening;
an upper insulation layer disposed on the conductor for covering the conductor and the lower insulation layer;
a test coupon disposed on the substrate for evaluating the conductor;
a product part to be cut from the circuit board; and
a frame for supporting the product part,
wherein the test coupon is disposed in the frame,
wherein the test coupon is an adhesiveness measurement test coupon for measuring an adhesiveness between the unit conductive pattern and the conductor.

26. The circuit board according to claim 25, wherein the adhesiveness measurement test coupon includes a part of the conductor exposed on the surface of the circuit board and disposed on the unit conductive pattern through the unit opening.

27. A circuit board comprising:
a substrate;
an unit conductive pattern disposed on a surface of the substrate;
a lower insulation layer disposed on the unit conductive pattern to cover the unit conductive pattern except for an unit opening, through which the unit conductive pattern is partially exposed from the lower insulation layer;
a conductor disposed on the lower insulation layer and connecting to the unit conductive pattern through the unit opening;
an upper insulation layer disposed on the conductor for covering the conductor and the lower insulation layer;
a test coupon disposed on the substrate for evaluating the conductor;
a product part to be cut from the circuit board; and
a frame for supporting the product part,
wherein the test coupon is disposed in the frame,
wherein the test coupon is an insulation performance measurement test coupon for measuring an insulation performance of the lower insulation layer.

28. The circuit board according to claim 27, wherein the unit conductive pattern includes a pair of conductive patterns, wherein the test coupon includes a pair of conductive patterns, the lower insulation layer, and the opening, wherein each of the conductive patterns includes a comb-tooth portion having a plurality of comb-teeth, wherein each of the comb-teeth includes a tooth side, which faces another tooth side of the neighboring one of the comb-teeth, and wherein both of the comb-tooth portions of the conductive patterns are covered with the lower insulation layer.

29. The circuit board according to claim 28, wherein the lower insulation layer includes first, second and third lower insulation layers, which are laminated on the substrate in this order, and wherein the second and third lower insulation layers cover both of the comb-tooth portion.

30. The circuit board according to claim 28, wherein the lower insulation layer includes first, second and third lower insulation layers, which are laminated on the substrate in this order, and wherein the third lower insulation layer covers both of the comb-tooth portion.

* * * * *